(12) United States Patent
Kim et al.

(10) Patent No.: US 8,253,128 B2
(45) Date of Patent: Aug. 28, 2012

(54) ORGANIC LIGHT EMITTING DIODE DISPLAY

(75) Inventors: Eun-Ah Kim, Suwon-si (KR);
Chul-Woo Jeong, Suwon-si (KR);
Hee-Chul Jeon, Suwon-si (KR);
Noh-Min Kwak, Suwon-si (KR);
Woo-Suk Jung, Suwon-si (KR);
Joo-Hwa Lee, Suwon-si (KR);
Hee-Seong Jeong, Suwon-si (KR);
Soon-Ryong Park, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 330 days.

(21) Appl. No.: 12/642,732

(22) Filed: Dec. 18, 2009

(65) Prior Publication Data
US 2010/0171105 A1 Jul. 8, 2010

(30) Foreign Application Priority Data
Jan. 7, 2009 (KR) ........................ 10-2009-0001162

(51) Int. Cl.
*H01L 35/24* (2006.01)
(52) U.S. Cl. ........ 257/40; 257/59; 257/72; 257/E51.001
(58) Field of Classification Search .................... 257/40, 257/59, 72, E51.001
See application file for complete search history.

(56) References Cited

U.S. PATENT DOCUMENTS

| | | |
|---|---|---|
| 2007/0257609 A1 | 11/2007 | Fukuda et al. |
| 2010/0033087 A1 | 2/2010 | Kim et al. |

FOREIGN PATENT DOCUMENTS

| | | |
|---|---|---|
| CN | 101645455 A | 2/2010 |
| EP | 2 009 715 A2 | 12/2008 |
| JP | 62-219492 A | 9/1987 |
| JP | 10-074582 | 3/1998 |
| JP | 2002-252086 | 9/2002 |
| JP | 2004-234942 | 8/2004 |
| JP | 2004-311305 A | 11/2004 |
| JP | 2004-348971 | 12/2004 |
| JP | 2005-227788 | 8/2005 |
| JP | 2005-347246 | 12/2005 |

(Continued)

OTHER PUBLICATIONS

European Office action dated Jul. 3, 2012, for corresponding European Patent application 10250012.1, (5 pages).

*Primary Examiner* — Anthony Ho
(74) *Attorney, Agent, or Firm* — Christie, Parker & Hale, LLP

(57) ABSTRACT

An organic light emitting diode display includes a substrate, a thin film transistor on the substrate and including a gate electrode, a source electrode, and a drain electrode, a planarization layer on the thin film transistor and having a contact hole exposing a portion of one of the drain electrode or the source electrode, a pixel electrode on the planarization layer and coupled to the one of the drain electrode or the source electrode through the contact hole, a colored pixel defining layer on the planarization layer and including an opening exposing at least a portion of the pixel electrode, and a colored layer on the pixel electrode and the pixel defining layer and having a chromatic color different from a chromatic color of the pixel defining layer.

12 Claims, 5 Drawing Sheets

FOREIGN PATENT DOCUMENTS

| | | |
|---|---|---|
| JP | 2006-269227 | 10/2006 |
| JP | 2007-103027 | 4/2007 |
| JP | 2007-234301 | 9/2007 |
| JP | 2008-077943 | 4/2008 |
| JP | 2008-078038 | 4/2008 |
| KR | 10-2005-0049688 A | 5/2004 |
| KR | 10-2004-0073649 A | 8/2004 |
| KR | 10-2006-0030436 A | 4/2006 |

ORGANIC LIGHT EMITTING DIODE DISPLAY

CROSS-REFERENCE TO RELATED APPLICATION

This application claims priority to and the benefit of Korean Patent Application No. 10-2009-0001162 filed in the Korean Intellectual Property Office on Jan. 7, 2009, the entire content of which is incorporated herein by reference.

BACKGROUND OF THE INVENTION

1. Field of the Invention

The present invention relates to an organic light emitting diode (OLED) display. More particularly, the present invention relates to an OLED with improved visibility.

2. Description of the Related Art

An organic light emitting diode (OLED) display includes a plurality of OLEDs each having a hole-injection electrode, an organic emission layer, and an electron-injection electrode. OLEDs emit light using energy generated when excitons, generated by the combination of electrons and holes in the organic emission layer, fall from an excited state to a ground state. The OLED display forms an image using the light emitted from the OLEDs.

Accordingly, an OLED display has a self-emissive characteristic and, unlike a liquid crystal display, does not need a separate light source. Therefore, OLED displays can have reduced thickness and weight. In addition, since OLED displays have characteristics such as low power consumption, high luminance, and fast response times, OLED displays are drawing attention as a viable alternative display device.

In general, the electrodes and metal lines of an OLED display reflect light introduced from the outside. Such light reflection on the electrodes and metal lines deteriorates expression of black color and contrast, thereby deteriorating display characteristics.

The above information disclosed in this Background section is only for enhancement of understanding of the background of the invention, and therefore may contain information that does not form the prior art that is already known in this country to a person of ordinary skill in the art.

SUMMARY OF THE INVENTION

Exemplary embodiments of the present invention provide an OLED display having improved visibility by suppressing or reducing reflected light on a screen.

In one exemplary embodiment, an OLED display includes a substrate, a thin film transistor on the substrate and including a gate electrode, a source electrode, and a drain electrode, a planarization layer on the thin film transistor and having a contact hole exposing a portion of one of the drain electrode or the source electrode, a pixel electrode on the planarization layer and coupled to the one of the drain electrode or the source electrode through the contact hole, a colored pixel defining layer on the planarization layer and including an opening exposing at least a portion of the pixel electrode, and a colored layer on the pixel electrode and the pixel defining layer and having a chromatic color different from a chromatic color of the pixel defining layer.

The OLED display may further include an organic emission layer on the pixel electrode, and a common electrode on the organic emission layer, wherein the colored layer includes a covering layer on the common electrode for protecting the organic emission layer.

The colored layer may include a sealing member on the substrate, wherein the pixel electrode and pixel defining layer are between the sealing member and the substrate.

The OLED display may further include an organic emission layer on the pixel electrode, a common electrode on the organic emission layer, and a sealing member on the substrate, wherein the common electrode is between the substrate and the sealing member, and wherein the colored layer comprises a filling layer between the sealing member and the common electrode.

The OLED display may further include a sealing member on the substrate, wherein the pixel electrode and pixel defining layer are between the sealing member and the substrate, and wherein the colored layer comprises a covering window on the sealing member.

The color of the pixel defining layer mixed with the color of the colored layer may reduce brightness of light passing through both the pixel defining layer and the colored layer.

The color of the pixel defining layer may be in a complementary relationship with the color of the colored layer based on subtractive color mixing.

The OLED display may further include a conductive layer including a same material as at least one of the gate electrode, the source electrode, or the drain electrode, wherein the conductive layer is on a substantially same plane and formed by utilizing a substantially same process as the at least one of the gate electrode, the source electrode, or the drain electrode, and wherein at least a portion of the conductive layer overlaps with the pixel defining layer.

Accordingly, the OLED display has improved display qualities.

DETAILED DESCRIPTION OF THE EMBODIMENTS

Figure 1:
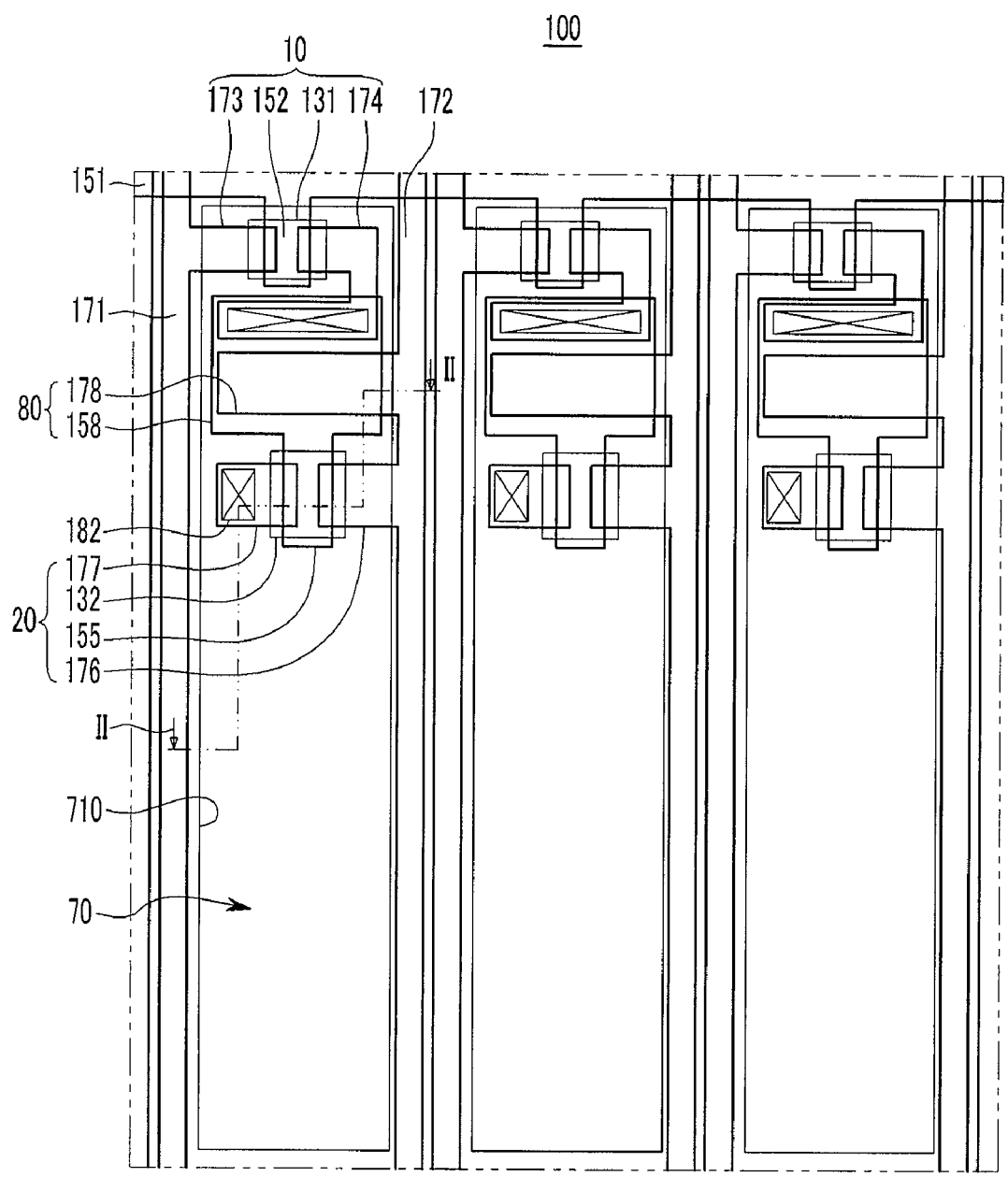
FIG. 1 is a layout view of an OLED display according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways without departing from the spirit or scope of the present invention.

In order to clearly illustrate layers and regions, thicknesses and sizes thereof are exemplarily illustrated, and thus, embodiments of the present invention are not limited thereto.

Accordingly, the drawings and description are to be regarded as illustrative in nature and not restrictive. Like reference numerals designate like elements throughout the specification.

In the drawings, the thickness of layers, films, panels, regions, etc., are exaggerated for clarity. It is to be understood that when an element, such as a layer, film, region, or substrate, is referred to as being "on" another element, it can be directly on the other element, or one or more intervening elements may also be present. In contrast, when an element is referred to as being "directly on" another element, there are no intervening elements present.

In addition, when describing a variety of exemplary embodiments, like reference numerals designate like elements which will be described in detail only in the first exemplary embodiment. Therefore, in other exemplary embodiments, only different elements will be described in detail.

Further, although an active matrix type of OLED display of a 2Tr-1Cap structure, in which one pixel has two thin film transistors and one capacitor, is illustrated in the accompanying drawings, the present invention is not limited thereto. Therefore, the OLED display may be formed with pixels each having, for example, three or more thin film transistors and/or two or more capacitors. In addition, the OLED display may be formed in a variety of structures by adding, for example, additional metal lines.

Here, a pixel is a smallest unit that can display an image, and the OLED display generally displays an image using a plurality of pixels.

An OLED display in accordance with a first exemplary embodiment of the present invention will be described hereinafter with reference to FIGS. 1 and 2.

Figure 2:
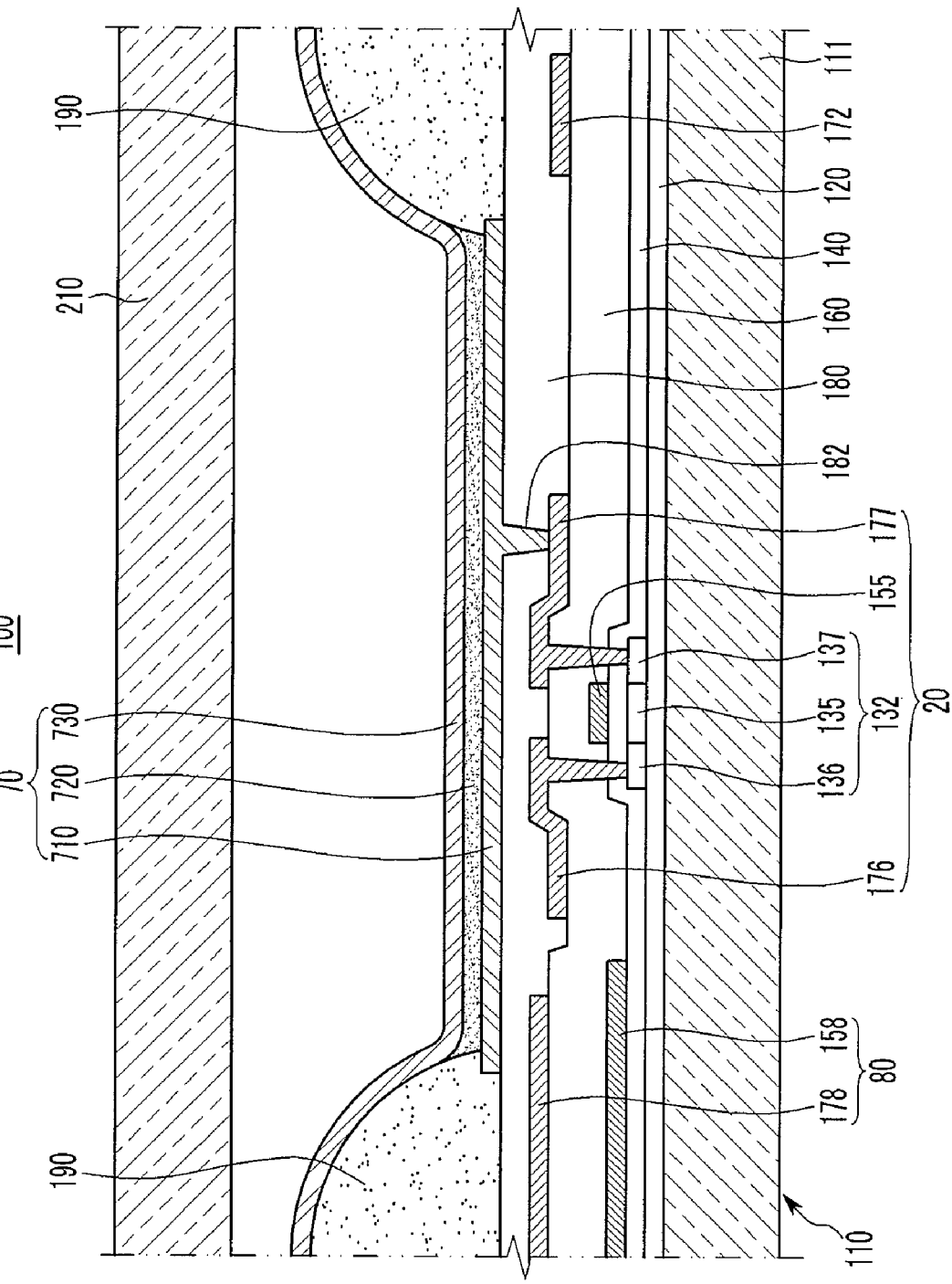
FIG. 2 is a cross-sectional view taken along line II-II of FIG. 1.

As shown in FIGS. 1 and 2, an OLED display 100 of the first exemplary embodiment of the present invention includes a plurality of pixels each having a switching thin film transistor 10, a driving thin film transistor 20, a capacitor 80, and an OLED 70. The OLED display 100 further includes gate lines 151 extending in one direction and data lines 171 and common power lines 172 extending in another direction, crossing the gate lines 151 and insulated from the gate lines 151. Here, the pixels may be divided and defined by corresponding surrounding gate, data, and common power lines 151, 171, and 172. However, the pixels are not limited to the above-described configuration.

The OLED 70 includes a pixel electrode 710, an organic emission layer 720 formed on the pixel electrode 710, and a common electrode 730 formed on the organic emission layer 720. Here, the pixel electrode 710 is an anode that is a hole-injection electrode, and the common electrode is a cathode that is an electron-injection electrode. However, the first exemplary embodiment of the present invention is not limited to this configuration. For example, in accordance with a driving method of the OLED display 100, the pixel electrode 710 may be the cathode and the common electrode 730 may be the anode. Holes and electrons are injected from respective pixel electrodes and common electrodes 710 and 730 into the organic emission layers 720. Light emission is realized when excitons generated by the combination of the electrons and holes in the organic emission layer fall from an excited state to a ground state.

The capacitor 80 includes first and second capacitor plates 158 and 178 between which an interlayer dielectric 160 is disposed.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 functions as a switching element and selects a pixel that will emit light. The switching gate electrode 152 is connected to the gate line 151. The switching source electrode 173 is connected to the data line 171. The switching drain electrode 174 is spaced apart from the switching source electrode 173 and connected to the first capacitor plate 158.

The driving thin film transistor 20 applies driving power to the pixel electrode 710 to emit light from the organic emission layer 720 of the OLED 70 in the selected pixel. The driving gate electrode 155 is connected to the first capacitor plate 158. The driving source electrode 176 and the second capacitor plate 178 are connected to the common power line 172. The driving drain electrode 177 is connected to the pixel electrode 710 of the OLED 70 through a contact hole 182. In some embodiments, instead of the driving drain electrode 177, the driving source electrode 176 is connected to the pixel electrode 710 of the OLED 70 through the contact hole 182.

With the above-described structure, the switching thin film transistor 10 is driven by a gate voltage applied to the gate line 151 for transferring a data voltage applied to the data line 171 to the driving thin film transistor 20. A voltage corresponding to a difference between the common voltage applied from the common power line 172 and the data voltage transferred from the switching thin film transistor 10 is stored in the capacitor 80. A current corresponding to the voltage stored in the capacitor 80 flows to the OLED 70 through the driving thin film transistor 20, such that the OLED 70 emits light.

In addition, as shown in FIG. 2, the OLED display 100 further includes a pixel defining layer 190 and a sealing member 210.

The pixel defining layer 190 is provided with openings exposing the pixel electrodes 710. The organic emission layer 720 is substantially disposed in the openings of the pixel defining layer 190. That is, a portion of one pixel on which the pixel defining layer 190 is formed substantially corresponds to a portion on which the organic emission layer 720 is not formed. Accordingly, at least portions of a conductive layer having a same material as at least one of the gate electrodes 152 and 155, the source electrodes 173 and 176, and the drain electrodes 174 and 177 on a substantially same plane through a substantially same process is arranged under the pixel defining layer 190. For example, the conductive layer may be one of the gate line 151, the data line 171, the common power line 172, the first capacitor plate 158, the second capacitor plate 178, and/or one of other metal lines. Further, the pixel defining layer 190 is formed with a color (e.g., a chromatic color).

The sealing member 210 is coupled to and sealed with a substrate member 111 with the pixel defining layer 190 disposed between the sealing member 210 and the substrate member 111. The structure defined by the constitutional elements except for the sealing member 210 is referred to as a display substrate 110. The sealing member 210 covers and protects the thin film transistors 10 and 20 and the OLED 70, which are formed on the substrate member 111, from an external environment.

A dielectric substrate formed of a glass or plastic material may be used as the sealing member 210. In addition, the sealing member 210 is also formed with a color (e.g., a chromatic color). The chromatic color of the sealing member 210 is different from that of the pixel defining layer 190. Specifically, the sealing member is formed with a chromatic color that can lower brightness when mixed with the chromatic color of the pixel defining layer 190. That is, the color of the pixel defining layer 190 and the color of the sealing member 210 lower brightness when they are overlapped.

In one embodiment, the pixel defining layer 190 is formed with a color that is set in a complementary relationship with the color of the sealing member 210 by subtractive color mixing.

That is, the color of the sealing member 210 and the color of the pixel defining layer 190 are complementary colors based on subtractive color mixing.

With the above-described structure, the OLED display 100 suppresses or reduces light reflection on the screen and thus has improved visibility.

In more detail, light introduced from the outside and reflected on the conductive layer disposed under the pixel defining layer 190 is lowered in brightness by the colors of the pixel defining layer 190 and the sealing member 210 while passing through the pixel defining layer 190 and the sealing member 210. Particularly, when the color of the sealing member 210 and the color of the pixel defining layer 190 are set in a complementary relationship with each other by subtractive color mixing, the mixed color may be close to a black color, and thus the light reflection on the screen may effectively be suppressed or reduced, as it may be difficult for reflected light to pass through the pixel defining region 190 and the sealing member 210.

For example, when the pixel defining layer 190 has a yellow-based color, the sealing member 210 may have a blue-based color that is set in a complementary relationship with the yellow-based color of the pixel defining layer 190 by subtractive color mixing. At this point, the pixel defining layer 190 functions as a yellow color filter, and thus only reflected yellow light can pass through the pixel defining layer 190. Further, since the brightness of the reflected yellow light is significantly reduced as the yellow light passes through the sealing member 210 formed with the blue-based color, the reflection of the external light on the conductive layer disposed under the pixel defining layer 190 may be suppressed or reduced. However, the first exemplary embodiment of the present invention is not limited to the above-described configuration. That is, the pixel defining layer 190 and the sealing member 210 may be formed with a variety of colors that can be subtractively mixed with each other.

An OLED display 100 according to the first exemplary embodiment of the present invention will be described hereinafter in more detail with reference to FIG. 2. FIG. 2 illustrates an OLED display 100, including a driving thin film transistor 20, an OLED 70, and a capacitor 80.

A structure of the thin film transistor will be described in more detail with reference to the driving thin film transistor 20. In addition, a switching thin film transistor 10 will be described only with respect to differences from the driving thin film transistor 20.

A substrate member 111 is a dielectric substrate that is formed of glass, quartz, ceramic, plastic, or a similar material. However, the present invention is not limited thereto. For example, the substrate member 111 may be a metal substrate formed of stainless steel.

A buffer layer 120 is formed on the substrate member 111. The buffer layer 120 functions to prevent infiltration of impurity elements and planarize a surface. The buffer layer 120 may be formed of a variety of materials that can perform these functions. For example, the buffer layer 120 may be formed of one of $SiNx$, $SiO_2$, or $SiOxNy$. In some embodiments, the buffer layer 120 is not implemented. That is, the buffer layer 120 may be omitted in accordance with the type of substrate member 111 utilized and/or process conditions.

A driving semiconductor layer 132 is formed on the buffer layer 120. The driving semiconductor layer 132 is formed of polysilicon. In addition, the driving semiconductor layer 132 includes a channel region 135 which is not doped with impurities, and source and drain regions 136 and 137 that are doped with p+ ions and formed at both sides of the channel region 135, respectively. The ion material doped in the source and drain regions 136 and 137 is a P-type impurity such as boron (B), for example $B_2H_6$. Here, the impurities may be varied depending on the type of thin film transistor.

In the first exemplary embodiment of the present invention, a p-channel metal-oxide semiconductor (PMOS) using p-type impurities is used as the driving thin film transistor 20. However, the present invention is not limited to this. That is, an n-channel metal-oxide semiconductor (NMOS) or a complementary metal-oxide semiconductor (CMOS) may instead be used as the driving thin film transistor 20.

In addition, although the driving thin film transistor 20 illustrated in FIG. 2 is a polycrystalline thin film transistor having a polycrystalline silicon layer, a switching thin film transistor 10 that is not illustrated in FIG. 2 may be, for example, a polycrystalline thin film transistor or an amorphous thin film transistor having an amorphous silicon layer.

A gate dielectric 140 formed of $SiNx$ or $SiO_2$, for example, is formed on the driving semiconductor layer 132. A gate metal line including the driving gate electrode 155 is formed on the gate dielectric 140. The gate metal line 151 (see FIG. 1) further includes the first capacitor plate 158 and other metal lines. Further, the driving gate electrode 155 is formed such that it overlaps at least a portion of the driving semiconductor layer 132, particularly, the channel region 135.

An interlayer dielectric 160 covering the driving gate electrode 155 is formed on the gate dielectric 140. The gate dielectric 140 and the interlayer dielectric 160 are provided with through holes exposing the source and drain regions 136 and 137 of the driving semiconductor layer 132. Like the gate dielectric 140, the interlayer dielectric 160 may be formed of $SiNx$ or $SiO_2$.

Data metal lines including the driving source electrode 176 and the driving drain electrode 177 are formed on the interlayer dielectric 160. The data metal lines further include the data line 171 (see FIG. 1), common power lines 172, and second capacitor plate 178. In addition, the driving source electrode 176 and the driving drain electrode 177 are respectively connected to the source and drain regions 136 and 137 of the driving semiconductor layer 132 through the respective through holes.

As described above, the driving thin film transistor 20 including the driving semiconductor layer 132, the driving gate electrode 155, the driving source electrode 176, and the driving drain electrode 177 is formed.

The driving thin film transistor 20 is not limited to the above-described structure. That is, it would be possible for those skilled in the art to make various modifications and variations based on various well-known structures.

A planarization layer 180 covering the data metal lines 172, 176, 177, and 178 is formed on the interlayer dielectric 160. The planarization layer 180 functions to eliminate steps and planarize a surface, thereby improving luminous efficiency of the OLED 70. In addition, the planarization layer 180 is provided with a contact hole for partly exposing the drain electrode 177.

The planarization layer 180 may be formed of at least one of a polyacrylate resin, an epoxy resin, a phenolic resin, a polyamide resin, a polyimide resin, an unsaturated polyester resin, a poly(phenylene ether) resin, a poly(phenylene sulfide) resin, and/or benzocyclobutene (BCB).

The pixel electrode 710 of the OLED 70 is formed on the planarization layer 180. The pixel electrode 710 is connected to the drain electrode 177 through the contact hole 182 of the planarization layer 180.

In addition, the pixel defining layer 190 having openings exposing the pixel electrodes 710 is formed on the planarization layer 180. That is, the pixel electrodes 710 are located to correspond to the openings of the pixel defining layer 190.

The pixel defining layer 190 may be formed of a resin such as a polyacrylate resin and a polyimide resin.

The organic emission layer 720 is formed on the pixel electrode 710 in the opening of the pixel defining layer 190. The common electrode 730 is formed on both the pixel defining layer 190 and the organic emission layer 720.

As described above, the OLED 70 including the pixel electrode 710, the organic emission layer 720, and the common electrode 730 is formed.

One of the pixel electrode 710 and the common electrode 730 may be formed of a transparent conductive material, and the other may be formed of a translucent or reflective conductive material. The OLED display may be a front emitting type OLED display, a rear emitting type OLED display, or a both-side emitting type OLED display, depending on the materials of the pixel electrode 710 and the common electrode 730. Meanwhile, the OLED display 100 of the first exemplary embodiment of the present invention is a front emitting type OLED display. That is, the OLED 70 emits light toward the common electrode 730 to display an image.

Indium tin oxide (ITO), indium zinc oxide (IZO), zinc oxide (ZnO), or indium oxide ($In_2O_3$) may be used as a transparent conductive material. Lithium (Li), calcium (Ca), fluoridation lithium/aluminum (LiF/Al), aluminum (Al), silver (Ag), magnesium (Mg), or gold (Au) may be used as a reflective material.

The organic emission layer 720 may be formed of a low or high molecular weight organic material. The organic emission layer 720 is a multilayer having a hole-injection layer (HIL), a hole-transporting layer (HTL), an emission layer, an electron-transporting layer (ETL), an electron-injection layer (EIL), and the like. That is, the HIL may be disposed on the pixel electrode 710 serving as an anode, and the HTL, emission layer, ETL, and EIL may be sequentially stacked on the HIL.

The sealing member 210 is disposed above the OLED 70. The sealing member 210 is arranged opposite to the substrate member 111 to cover the thin film transistor 20 and the OLED 70.

The sealing member 210 is formed with a color that is set in a complementary relationship with a color of the pixel defining layer 190 by subtractive color mixing. That is, when the color of the pixel defining layer 190 is mixed with the color of the sealing member 210, the brightness of the mixed color is reduced.

In the first exemplary embodiment of the present invention, the sealing member 210 is formed with a blue-based color so that it can have relatively high permeability for blue-based light. Therefore, when an OLED display 100 has low efficiency for a blue-based color, the use of the sealing member 210 having a blue-based color may make the OLED display 100 more effective. In addition, the pixel defining layer 190 may be formed with a yellow-based color.

Therefore, the brightness of the external light reflected on the conductive layer disposed under the pixel defining layer 190 is lowered by the subtractive mixing of the colors of the pixel defining layer 190 and sealing member 210 through which the reflected external light passes. The pixel defining layer 190 and the sealing member 210 are not limited to the above-described structures. That is, the pixel defining layer 190 and the sealing member 210 may be formed with various colors that are subtractively mixed with each other.

Figure 3:
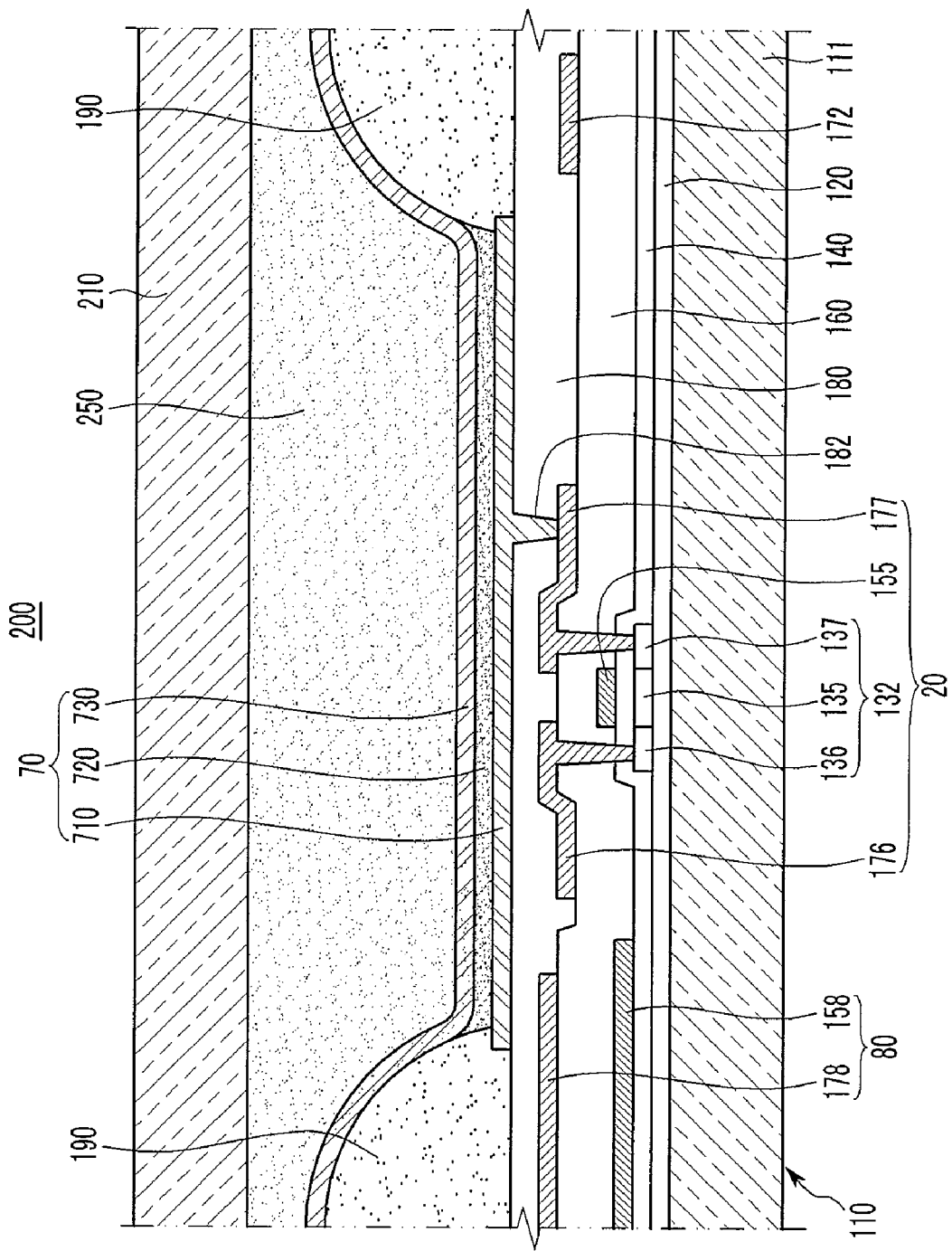
FIG. 3 is a cross-sectional view of an OLED display according to a second exemplary embodiment of the present invention.

The following will describe a second exemplary embodiment of the present invention with reference to FIG. 3.

As shown in FIG. 3, an OLED display 200 further includes a filling layer 250 arranged between an OLED 70 and a sealing member 210. The filling layer 250 may securely fix the sealing member 210, prevent moisture and foreign substances from being infiltrated into the OLED 70, and reduce the light reflection caused by a refractive index difference.

In addition, the filling layer 250 may be formed of a resin-based material having a color (e.g., a chromatic color). On the other hand, the sealing member 210 of the OLED display 200 of the second exemplary embodiment of the present invention may, for example, be transparent or translucent.

Further, the pixel defining layer 190 and the filling layer 250 may have different chromatic colors from each other. Particularly, the filling layer 250 is formed with a chromatic color that may lower brightness when mixed with a chromatic color of the pixel defining layer 190. That is, the color of the pixel defining layer 190 and the color of the filling layer 250 lower brightness when they are overlapped.

In one embodiment, the pixel defining layer 190 is formed with a color that is set in a complementary relationship with the color of the filling layer 250 by subtractive color mixing.

With the above-described structure, the OLED display 200 suppresses the light reflection on the screen and thus has improved visibility.

In more detail, the light introduced from the outside and reflected on the conductive layer disposed under the pixel defining layer 190 is lowered in its brightness by the colors of the pixel defining layer 190 and the filling layer 250 while passing through the pixel defining layer 190 and the filling layer 250. Particularly, when the color of the pixel defining layer 190 and the color of the filling layer 250 are set in a complementary relationship with each other by subtractive color mixing, the mixed color is close to a black color, and the light reflection on the screen can be more effectively suppressed or reduced as it may be difficult for reflected light to pass through the pixel defining region 190 and the filling layer 250.

For example, when the pixel defining layer 190 has a yellow-based color, the filling layer 250 may have a blue-based color that is set in a complementary relationship with the yellow-based color of the pixel defining layer 190 by subtractive color mixing. At this point, the pixel defining layer 190 functions as a yellow color filter and thus only reflected yellow light may pass through the pixel defining layer 190. Further, since the brightness of the yellow light is significantly reduced as the yellow light passes through the filling layer 250 formed with the blue-based color, the reflection of the external light on the conductive layer disposed under the pixel defining layer 190 may be suppressed or reduced. However, the second exemplary embodiment of the present invention is not limited to the above-described configuration. That is, the pixel defining layer 190 and the filling layer 250 may be formed with a variety of colors that can be subtractively mixed with each other.

Figure 4:
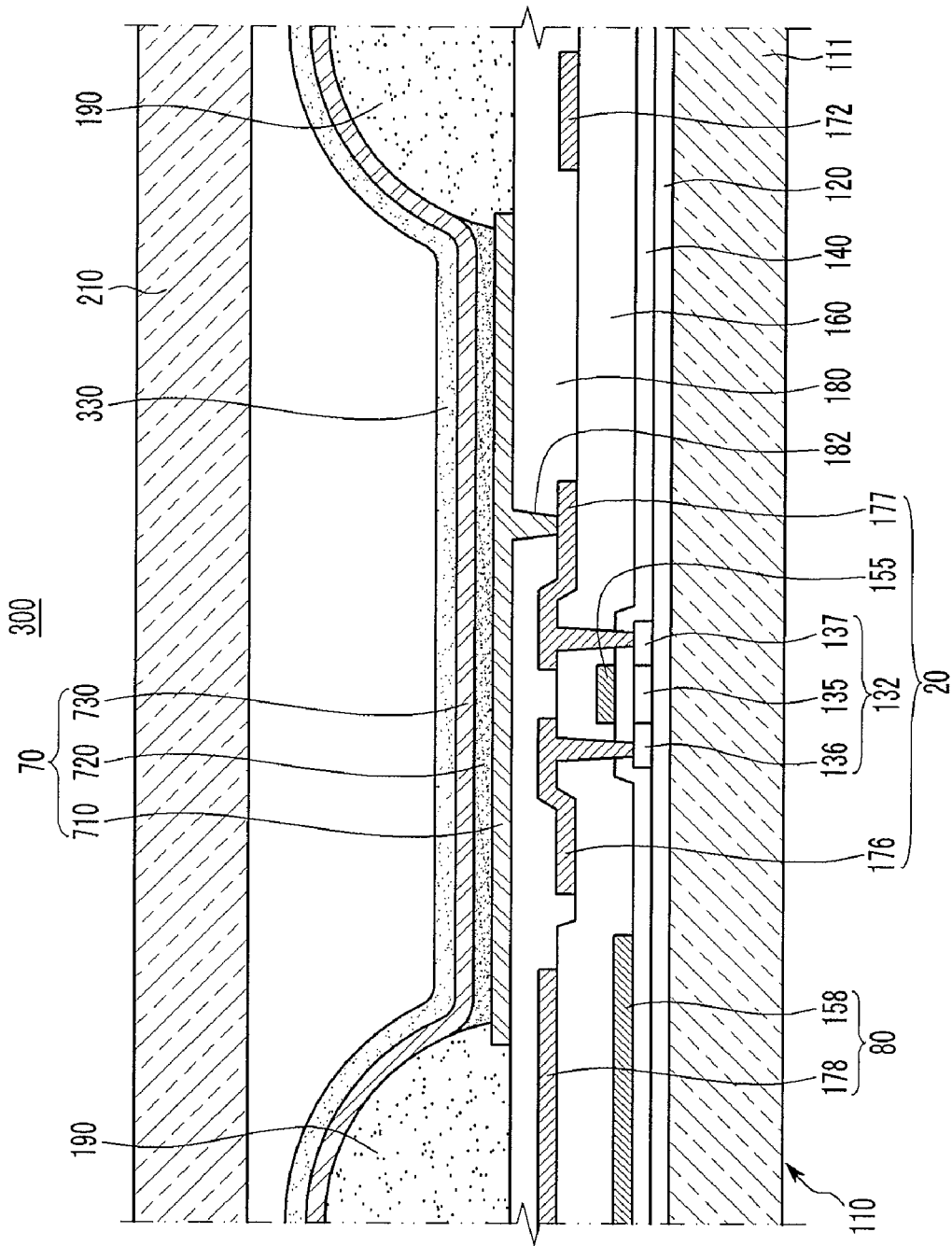
FIG. 4 is a cross-sectional view of an OLED display according to a third exemplary embodiment of the present invention.

The following will describe a third exemplary embodiment of the present invention with reference to FIG. 4.

As shown in FIG. 4, an OLED display 300 further includes a covering layer 330 covering a common electrode 730 of an OLED 70. The covering layer 330 is formed directly on the common electrode 730 to function to not only protect the OLED 70 but also to allow the light generated from the OLED 70 to be efficiently emitted.

The covering layer 330 is formed of an organic material such as Alq3, TPD, PBD, m-MTDATA, TCTA, NPD, and NPB, or an inorganic material such as SiNx, SiOx, and SiOxNy. Here, the organic material such as the Alq3, TPD, PBD, m-MTDATA, TCTA, NPD, and NPB may be used as a material for forming the organic emission layer 720.

In addition, the covering layer 330 is formed with a color (e.g., a chromatic color). On the other hand, the sealing member 210 of the OLED display 300 of the third exemplary embodiment of the present invention may, for example, be transparent or translucent.

Further, the pixel defining layer 190 and the covering layer 330 have different chromatic colors from each other. Particularly, the covering layer 330 is formed with a chromatic color that can lower brightness when mixed with a chromatic color of the pixel defining layer 190. That is, the color of the pixel defining layer 190 and the color of the covering layer 330 lower brightness when they are overlapped.

In one embodiment, the pixel defining layer 190 is formed with a color that is set in a complementary relationship with the color of the covering layer 330 by subtractive color mixing.

With the above-described structure, the OLED display 300 suppresses light reflection on the screen, and thus has improved visibility.

In more detail, the light introduced from the outside and reflected on the conductive layer disposed under the pixel defining layer 190 is lowered in its brightness by the colors of the pixel defining layer 190 and the covering layer 330 while passing through the pixel defining layer 190 and the covering layer 330. Particularly, when the color of the pixel defining layer 190 and the color of the covering layer 330 are set in a complementary relationship with each other by subtractive color mixing, the mixed color is close to a black color, and the light reflection on the screen can be more effectively suppressed or reduced as it may be difficult for reflected light to pass through the pixel defining region 190 and the covering layer 330.

For example, when the pixel defining layer 190 has a yellow-based color, the covering layer 330 may have a blue-based color that is set in a complementary relationship with the yellow-based color of the pixel defining layer 190 by subtractive color mixing. At this point, the pixel defining layer 190 functions as a yellow color filter and thus only reflected yellow light can pass through the pixel defining layer 190. Further, since the brightness of the yellow light is significantly reduced as the yellow light passes through the covering layer 330 formed with the blue-based color, the reflection of external light on the conductive layer disposed under the pixel defining layer 190 may be suppressed or reduced. However, the third exemplary embodiment of the present invention is not limited to the above-described configuration. That is, the pixel defining layer 190 and the covering layer 330 may be formed with a variety of colors that can be subtractively mixed with each other.

Figure 5:
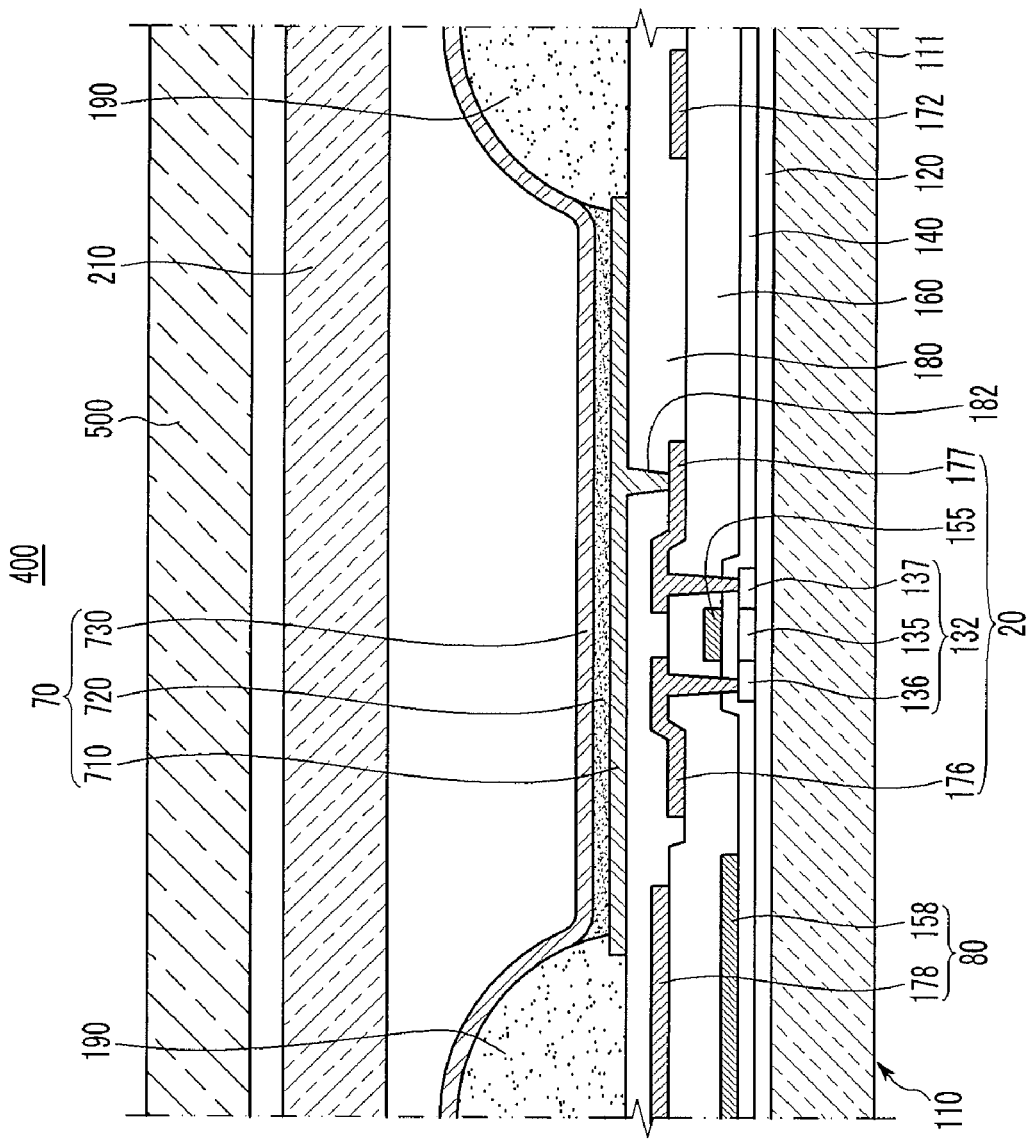
FIG. 5 is a cross-sectional view of an OLED display according to a fourth exemplary embodiment of the present invention.

The following will describe a fourth exemplary embodiment of the present invention with reference to FIG. 5.

As shown in FIG. 5, an OLED display 400 further includes a covering window 500 disposed on a sealing member 210. The covering window 500 is formed of a transparent material, such as glass or plastic, with a color (e.g., a chromatic color). On the other hand, the sealing member 210 of the OLED display 400 of the fourth exemplary embodiment of the present invention may, for example, be transparent or translucent.

Further, the pixel defining layer 190 and the covering window 500 have different chromatic colors from each other. Particularly, the covering window 500 is formed with a chromatic color that can lower brightness when mixed with a chromatic color of the pixel defining layer 190. That is, the color of the pixel defining layer 190 and the color of the covering window 500 lower brightness when they are overlapped.

In one embodiment, the pixel defining layer 190 is formed with a color that is set in a complementary relationship with the color of the covering window 500 by subtractive color mixing.

With the above-described structure, the OLED display 400 suppresses light reflection on the screen, and thus has improved visibility.

In more detail, the light introduced from the outside and reflected on the conductive layer disposed under the pixel defining layer 190 is lowered in its brightness by the colors of the pixel defining layer 190 and the covering window 500 while passing through the pixel defining layer 190 and the covering window 500. Particularly, when the color of the pixel defining layer 190 and the color of the covering window 500 are set in a complementary relationship with each other by subtractive color mixing, the mixed color is close to a black color, and the light reflection on the screen can be more effectively suppressed or reduced as it may be difficult for reflected light to pass through the pixel defining region 190 and the covering window 500.

For example, when the pixel defining layer 190 has a yellow-based color, the covering window 500 may have a blue-based color that is set in a complementary relationship with the yellow-based color of the pixel defining layer 190 by subtractive color mixing. At this point, the pixel defining layer 190 functions as a yellow color filter and thus only reflected yellow light can pass through the pixel defining layer 190. Further, since the brightness of the yellow light is significantly reduced as the yellow light passes through the covering window 500 formed with the blue-based color, the reflection of the external light on the conductive layer disposed under the pixel defining layer 190 may be suppressed or reduced. However, the fourth exemplary embodiment of the present invention is not limited to the above-described configuration. That is, the pixel defining layer 190 and the covering window 500 may be formed with a variety of colors that can be subtractively mixed with each other.

As described in the foregoing exemplary embodiments, light reflection on the screen may be suppressed by a combination of the colored pixel defining layer 190 and another colored layer having a different color (e.g., a different chromatic color) from the pixel defining layer 190. It is preferable that the color of the pixel defining layer 190 is set in a complementary relationship with the color of the other colored layer or layers. The colored layer may be one of the sealing member 210, the filling layer 250, the covering layer 330, or the covering window 500.

While this invention has been described in connection with what is presently considered to be practical exemplary embodiments, it is to be understood that the invention is not limited to the disclosed embodiments, but is instead intended to cover various modifications and equivalent arrangements included within the spirit and scope of the appended claims.

What is claimed is:

1. An organic light emitting diode display comprising:
   a substrate;
   a thin film transistor on the substrate and comprising a gate electrode, a source electrode, and a drain electrode;
   a planarization layer on the thin film transistor and having a contact hole exposing a portion of one of the drain electrode or the source electrode;
   a pixel electrode on the planarization layer and coupled to the one of the drain electrode or the source electrode through the contact hole;

a colored pixel defining layer on the planarization layer and including an opening exposing at least a portion of the pixel electrode; and a colored layer on the pixel electrode and the pixel defining layer and having a chromatic color different from a chromatic color of the pixel defining layer.

2. The organic light emitting diode display of claim 1, further comprising:

an organic emission layer on the pixel electrode; and a common electrode on the organic emission layer, wherein the colored layer comprises a covering layer on the common electrode for protecting the organic emission layer.

3. The organic light emitting diode display of claim 1, wherein the colored layer comprises a sealing member on the substrate, and wherein the pixel electrode and pixel defining layer are between the sealing member and the substrate.

4. The organic light emitting diode display of claim 1, further comprising:

an organic emission layer on the pixel electrode;

a common electrode on the organic emission layer; and a sealing member on the substrate, wherein the common electrode is between the substrate and the sealing member, and wherein the colored layer comprises a filling layer between the sealing member and the common electrode.

5. The organic light emitting diode display of claim 1, further comprising a sealing member on the substrate, wherein the pixel electrode and pixel defining layer are between the sealing member and the substrate, and wherein the colored layer comprises a covering window on the sealing member.

6. The organic light emitting diode display of claim 1, wherein the color of the pixel defining layer mixed with the color of the colored layer reduces brightness of light passing through both the pixel defining layer and the colored layer.

7. The organic light emitting diode display of claim 6, wherein the color of the pixel defining layer is in a complementary relationship with the color of the colored layer based on subtractive color mixing.

8. The organic light emitting diode display of claim 6, further comprising a conductive layer comprising a same material as at least one of the gate electrode, the source electrode, or the drain electrode, wherein the conductive layer is on a substantially same plane and formed by utilizing a substantially same process as the at least one of the gate electrode, the source electrode, or the drain electrode, and wherein at least a portion of the conductive layer overlaps with the pixel defining layer.

9. The organic light emitting diode display of claim 8, wherein the conductive layer comprises at least one of a gate line, a data line, a power line, or a capacitor plate.

10. The organic light emitting diode display of claim 6, wherein the mixing of the color of the pixel defining layer and the color of the colored layer creates a substantially black color.

11. The organic light emitting diode display of claim 1, wherein the color of the pixel defining layer is a yellow-based color, and the color of the colored layer is a blue-based color.

12. The organic light emitting diode display of claim 1, wherein the color of the colored layer provides color filtering for improving color efficiency of a selected color in a portion of the colored layer overlapping the exposed portion of the pixel electrode.

* * * * *

UNITED STATES PATENT AND TRADEMARK OFFICE
CERTIFICATE OF CORRECTION

PATENT NO. : 8,253,128 B2  
APPLICATION NO. : 12/642732  
DATED : August 28, 2012  
INVENTOR(S) : Kim et al.

Page 1 of 1

It is certified that error appears in the above-identified patent and that said Letters Patent is hereby corrected as shown below:

On the Title Page

Item [56] References Cited, FOREIGN PATENT DOCUMENTS, page 2, right column, line 3

Delete "5/2004" Insert -- 5/2005 --

Signed and Sealed this  
Seventeenth Day of December, 2013

Margaret A. Focarino  
*Commissioner for Patents of the United States Patent and Trademark Office*